United States Patent [19]
Uratsuji et al.

[11] Patent Number: 5,147,212
[45] Date of Patent: Sep. 15, 1992

[54] SOCKET FOR ELECTRIC PART

[75] Inventors: Kazumi Uratsuji, Tokyo; Noriyuki Matsuoka, Yokohama, both of Japan

[73] Assignee: Yamaichi Electric Co., Ltd., Tokyo, Japan

[21] Appl. No.: 715,485

[22] Filed: Jun. 14, 1991

[30] Foreign Application Priority Data

Jun. 15, 1990 [JP] Japan .................. 2-157119

[51] Int. Cl.$^5$ ............................................. H01R 11/22
[52] U.S. Cl. .................................... 439/266; 439/70
[58] Field of Search ..................... 439/68–73, 439/263, 264, 266–270

[56] References Cited

U.S. PATENT DOCUMENTS

| | | | |
|---|---|---|---|
| 4,623,208 | 11/1986 | Kerul et al. | 439/266 |
| 4,678,255 | 7/1987 | Carter | 439/267 |
| 4,691,975 | 9/1987 | Fukunaga et al. | 439/266 |
| 4,715,823 | 12/1987 | Ezura et al. | 439/267 |
| 4,846,703 | 7/1989 | Matsuoka et al. | 439/264 |
| 5,009,609 | 4/1991 | Matsuoka et al. | 439/264 |

*Primary Examiner*—Larry I. Schwartz
*Assistant Examiner*—Hien D. Vu
*Attorney, Agent, or Firm*—Wenderoth, Lind & Ponack

[57] ABSTRACT

A socket for an electric part has a movable contact shutter member which is disposed for upward and downward movement on an upper part of a socket body having a plurality of contacts adapted to contact with terminals of the electric part. Each of the contacts is displaced backward in a released position against the elasticity thereof when the contact shutter member is lowered. Each of the contacts is likewise displaced forward into a contact position in compliance with the elasticity thereof when the contact shutter member is raised. The socket for an electric part also has an electric supporting portion disposed on the contact shutter member and adapted to support the electric part, and a spring mechanism disposed on the socket body and adapted to push up the contact shutter member. A sliding movement is realized between the electric part terminals and the contacts because the electric part is pushed up by the supporting portion when the contact shutter member is raised by the resilient force of the spring mechanism.

9 Claims, 4 Drawing Sheets

SOCKET FOR ELECTRIC PART

BACKGROUND OF THE INVENTION

1. Field of the Invention

This invention relates to a socket for an electric part or component such as an IC, etc., and more particularly to a socket for an electric part including a contact shutter member for displacing contacts which are arranged on the socket body in order to be contacted with terminals of an electric part between a first position (hereinafter referred to as the "contact position") where the contacts are contacted with the terminals and a second position (hereinafter referred to as the "release position") where the contacts are no longer contacted with the terminals.

2. Brief Description of the Prior Art

An IC socket disclosed in U.S. Pat. No. 4,623,208, includes a socket body and a contact shutter member mounted on an upper part of the socket body in such a manner as to be movable upward and downward. The contact shutter member, when pushed down, displaces the contacts backward against elasticity to form a contact released state relative to IC terminals so that an IC can be inserted and removed with no load in that state. The contacts, when the push-down force of the contact shutter member is released, are displaced forward in compliance with the elasticity of the contacts to come into contact with the IC terminals in such a manner so as to exert a downward force to a bent portion of each of the IC terminals while pushing up the contact shutter member.

In the above-mentioned socket, the contacts are displaced forward in compliance with the elasticity and receive a contact pressure by being elastically pushed against the surfaces of the IC terminals which are held in a laterally stationary state. The reliability of the contact relation between each of the corresponding IC terminals and contacts depends on only the elasticity of these contacts.

On the other hand, high density arrangements of IC terminals has progressed in recent years, and miniaturization of contacts is required more than ever. If the contacts are miniaturized, however, the elastic coefficient inevitably becomes small, weakening the function thereof against the IC terminals and thus lowering the contact pressure. As a result, a problem arises in that it is difficult to obtain a highly reliable contact relation only by means of the elasticity of the contacts.

Further, although it is desirable that the contact shutter member can be operated with as small a push-down force as possible, the reduction of operating force in the conventional example also results in the reduction of the elastic force of the individual contacts, thereby lowering the contact pressure. In other words, in the conventional example, it is difficult to reduce the push-down operating force of the contact shutter member while maintaining the contact pressure the (elastic forces of the contacts).

The present invention has been accomplished in order to obviate the above-mentioned disadvantages inherent in the prior art.

SUMMARY OF THE INVENTION

It is therefore an object of the present invention to provide a socket for an electric part or component in which a reliable contact relation can be obtained while making it possible to miniaturize contacts, and therefore, even if the push-down operating force of a contact shutter member is reduced by miniaturizing the contacts (reducing the elastic forces), a reliable contact relation is not jeopardized.

As a means for achieving the above-mentioned object, the present invention is constructed such that a socket for an electric part includes a movable contact shutter member for movement upward and downward disposed at an upper part of a socket body. The socket for an electric part further includes an electric part supporting portion disposed at the contact shutter member and adapted to support the electric part. The contact shutter member is raised by a push-up force a spring mechanism provided with the socket body, and at the same time the electric part is pushed up by the supporting portion. A sliding movement is thus realized between the electric part terminals and the contacts under a pressure contact relation therebetween. As a result, an active metallic surface is exposed by the sliding movement to thereby attain a clean electric contact relation between the contacts and the terminals.

As described in the foregoing, by virtue of such a construction in that the contact shutter member is moved upward and downward to attain a contact relation and a released relation with the contacts, and pushing the electric part with the electric part supporting portion disposed on the contact shutter member when the contact shutter member is pushed up by the spring mechanism, a sliding movement can be realized between the terminals and the contacts at their contacted portions. By this, an oxide film can be removed at the contacted surfaces and a clean electric contact relation can be expected at the active metallic surfaces.

Therefore, a highly reliable contact relation can be obtained even with a comparatively weak contacting pressure. As a result, the invention can effectively cope with a high density arrangement of electric part terminals by miniaturizing the contacts. Furthermore, it can also achieve the object of reducing the push-down force an be exerted to the contact shutter member by miniaturizing the contacts, thereby reducing the elastic force thereof. As a result, the degree of freedom in designing a socket is expanded extensively.

Moreover, according to the present invention, the above-mentioned effect can be obtained every time the contact shutter member is moved upward and downward, that is, every time the electric part is inserted into the socket. Therefore, a highly reliable contact relation can surely be expected for each electric part which is inserted into and removed from the socket.

DETAILED DESCRIPTION OF THE EMBODIMENT

Figure 1:
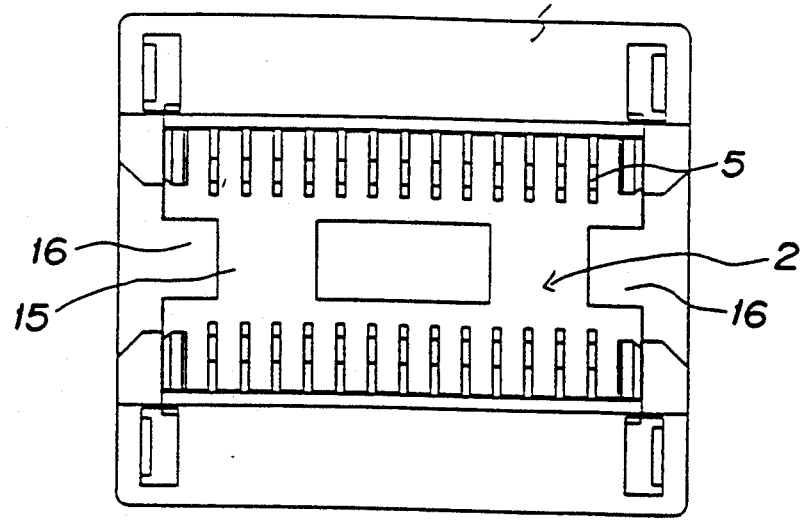
FIG. 1 is a plan view of a socket body according to one embodiment of the present invention.

The embodiment of the present invention will now be described with reference to FIGS. 1 through 5.

The numeral 1 denotes a rectangular socket body formed of an insulated material. The socket body 1 is provided with an electric part or component accommodating section 2 opening up at an upper surface thereof. On two opposing sides or all four sides of the accommodating section 2, a plurality of contacts 5 adapted to contact with terminals 4 of an electric part 3 are arranged.

Each of the contacts 5 has a male terminal 6 projecting downward from a lower surface of the socket body 1, a curved spring portion forming a first spring portion 7 extending upward from a base portion of the male terminal 6, a second spring portion 8 extending backward from an upper end portion of the first spring portion 7, a pressure bearing portion 9 formed of a rigid body and rising upwards from the backward end portion of the second spring portion 8, and a contact nose portion 10 projecting from a connecting portion between the first spring portion 7 and the second spring portion 8 and adapted to contact with pressure the corresponding terminal 4 of the electric part 3 accommodated in the accommodating section 2. The contact nose portion 10 is arranged in such a manner as to face the accommodating section 2.

The second spring portion 8 and pressure bearing portion 9 form a cantilever type lever. The pressure bearing portion 9 is displaceable upward and downward, using the connecting portion with the first spring portion 7 as a supporting point.

On the other hand, a contact shutter member 11, movable upward and downward, is disposed at an upper portion of the socket body 1. The contact shutter member 11 has an electric part load window 12 opposite the electric part accommodating section 2, and a frame portion defining the load window 12 is provided with a cam portion 13 opposite the tip of the pressure bearing portion 9 of the contact 5. The whole body of the contact shutter member 11 is supported by placing the cam portion 13 on the pressure bearing portion 9. The cam portion 13 has a first half surface gently inclined and a second half surface steeply inclined. The arrangement is such that a large displacement amount is obtained at the first half surface, gently inclined, in which the contact 5 is in an initial displacement stage and has a small elastic force, whereas a final displacement amount is obtained with a reduced force at the second half surface, steeply inclined, in which the contact 5 is in a last displacement stage and comes to have a large elastic force.

The contact shutter member 11 is integrally, as one piece provided with a supporting portion 14 for supporting the electric part 3. The supporting portion 14 is disposed in such a manner as to support, for example, the lower surface of opposing end portions of the electric part 3 accommodated in the electric part accommodating section 2 from opposing frame portions of the contact shutter member 11, as illustrated.

In this case, the contacts 5 are arranged in parallel relation on two opposing sides of the electric accommodating section 2. The electric part supporting portion 14 intervenes between the rows of contacts 5 from the other two opposing sides of the accommodating section 2 and supports the lower surface of the electric part 3. A bottom wall of the electric part accommodating section 2 forms a mount table 15, and guides 16 are formed in opposing end portions of the mount table 15. Each of the electric part supporting portions 14 is engaged with the corresponding guide 16 to guide the upward and downward movements of the supporting member 14 and the contact shutter member 11.

Figure 3A:
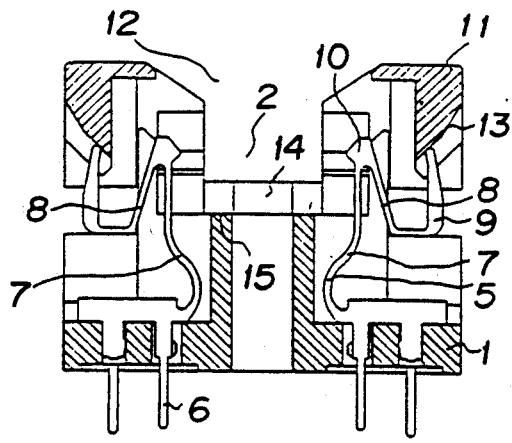
FIG. 3(A) is a cross sectional view of a socket in which the contact shutter member is pushed up and held in an upper position.
Figure 3B:
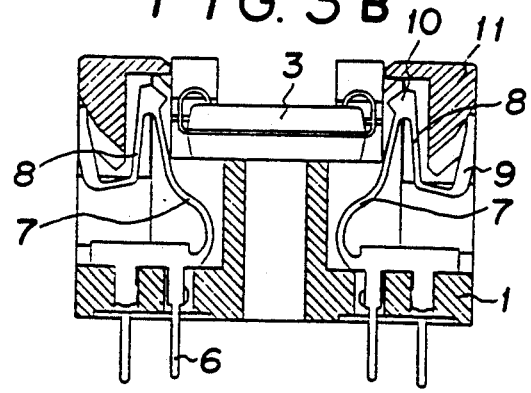
FIG. 3(B) is a cross sectional view of the socket in which the contact shutter member is pushed down to bring the contact into a released state and an electric part is inserted into the socket with no-load.
Figure 3C:
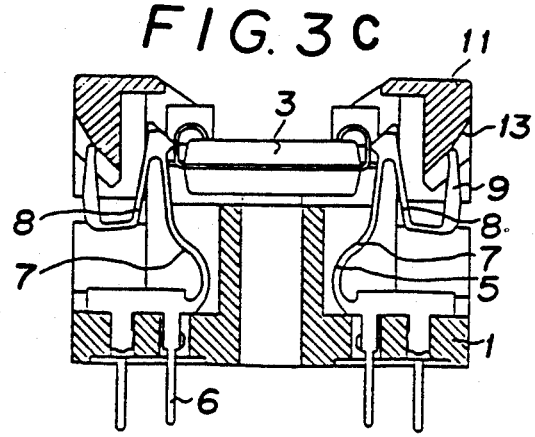
FIG. 3(C) is a cross sectional view of the socket wherein the contact shutter member is released from a push-down operation and the contact is in a state immediately after it is brought into contact (before sliding movement occurs on a contact nose portion) with a terminal of the electric part.
Figure 4A:
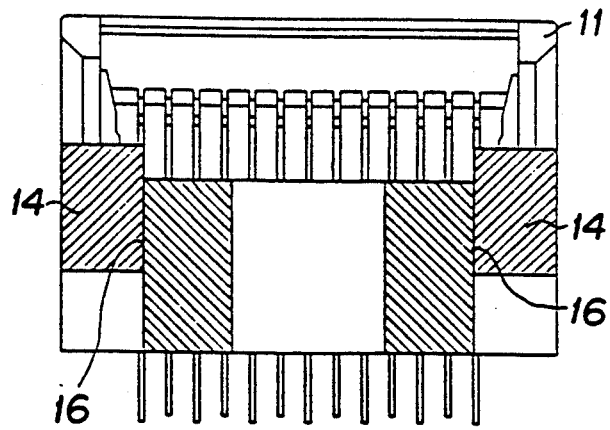
FIG. 4(A) is a vertical sectional view of FIG. 3(A)

As is shown in FIGS. 3(A) and 4(A), the contact shutter member 11 is supported in an upper position by the pressure bearing portions 9 of the contacts 5. When the contact shutter member 11 is pushed down from the upper position by hand or by a robot operation, the gently inclined surface of the cam portion 13 is lowered while pushing the pressure bearing portions 9 of the contacts 5. First, in an initial lowering stage, the contact shutter member 11 causes the second spring portion 8 to be bent prior to the bending of the first spring portion 7, and at the same time it causes the pressure bearing portion 9 to be displaced downward prior to the downward displacement of the contact nose portion 10.

Figure 2:
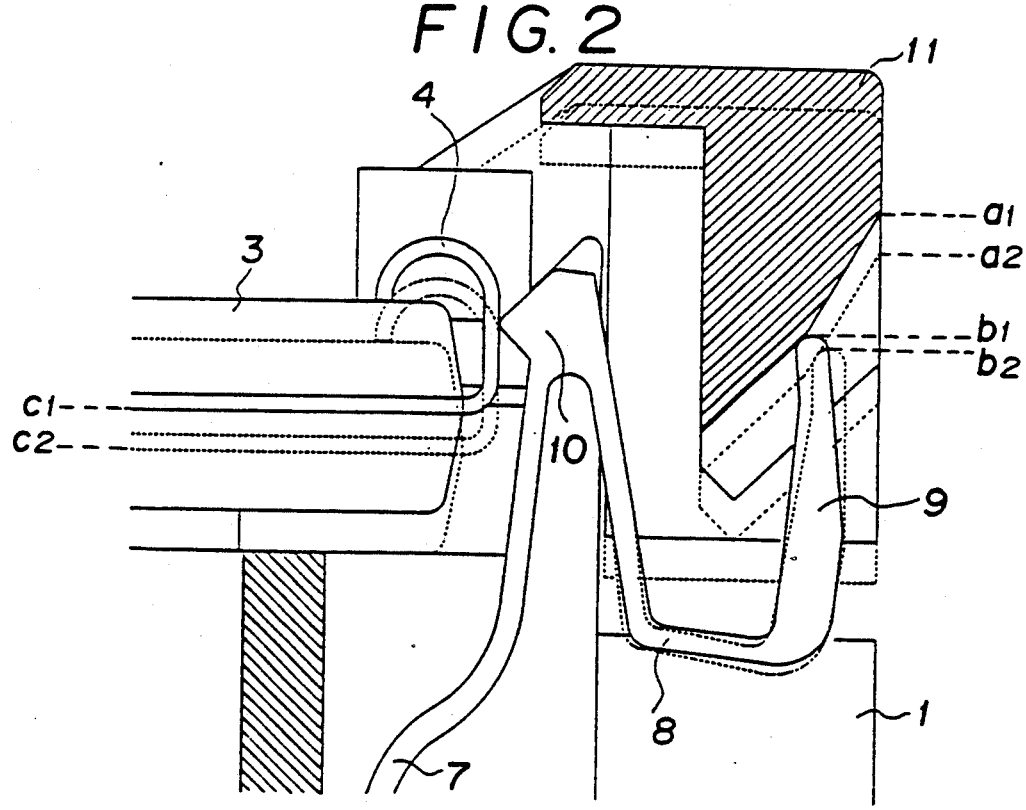
FIG. 2 is an enlarged sectional view showing the relation among upward and downward movements of a contact shutter member, elastic displacement of a contact and pull-up of an electric part.

That is, in the initial lowering stage of the contact shutter member 11, as shown in FIG. 2, the cam portion 13 is lowered from a position indicated by a solid line $a_1$ to a position indicated by an imaginary line $a_2$, and in association with the foregoing motion, the pressure bearing portion 9 is displaced downward from a position indicated by a solid line $b_1$ to a position indicated by an imaginary line $b_2$.

Figure 4B:
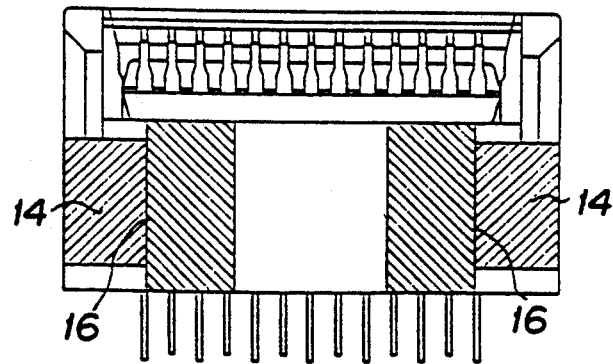
FIG. 4(B) is a vertical sectional view of FIG. 3(B)
Figure 4C:
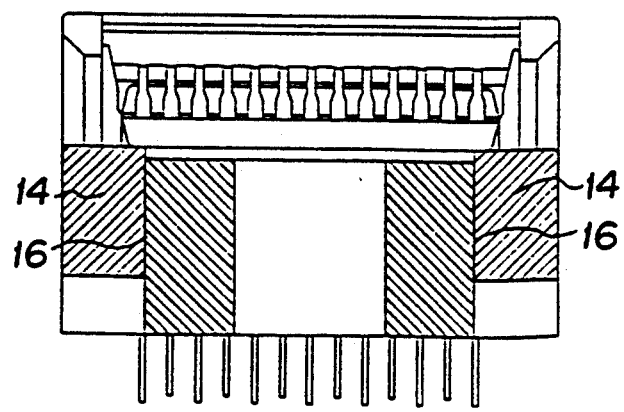
FIG. 4(C) is a vertical sectional view of FIG. 3(C)

When the contact shutter member 11 is continuously pushed further down, the pressure bearing portion 9 is further pushed down while being transferred from the gently inclined surface to the steeply inclined surface of the cam portion 13. At the same time, the first spring portion 7 starts bending to thereby displace the contact nose portion 10 backward into the released position to realize a released state of the accommodating section 2 (see FIG. 3(B) and 4(B)). In the foregoing state, the electric part 3, as represented by an IC, is inserted into the accommodating section 2 with no load and supported by the mount table 15 formed by the bottom wall of the accommodating section 2. At this time, the electric part supporting portion 14, as shown in FIG. 4(B), is lowered together with the lowering of the contact shutter member 11 and sunk into a position lower than the upper surface of the mount table 15, where it is held in a waiting state.

In this way, when the push-down force of the contact shutter member 11 is released after the insertion of the electric part 3, the first and second spring portions 7 and 8 are restored, and the contact nose portion 10 is displaced forward and laterally contacts pressure the surface of the electric part terminals 4. The contact nose portion 10 is continuously elastically restored, further, to displace the pressure bearing portion 9 upward to thereby push the contact shutter member 11 upward a predetermined amount (see FIGS. 3(C), and 4(C)). That is, after the contact nose portion 10 of the contact 5 is pressure contacted with the electric part terminal 4, the pressure bearing portion 9 is displaced upward from a position indicated by $b_2$ in FIG. 2 to a position indicated by $b_1$. In association with the foregoing motion, the contact shutter member 11 is pushed upward from the position indicated by $a_2$ to a position indicated by $a_1$ in the drawing. As a result, the supporting portion 14 of the contact shutter member 11 comes to a position higher than the upper surface of the mount table 15 to thereby push up the electric part 3.

During the upward movement of the electric part 3, the terminals 4 of the electric part 3 move upward from a position $c_2$ to a position $c_1$ in sliding contact with the contact nose portion 10. The friction generated by the mutual sliding contact between the terminal 4 and the contact nose portion 10 can provide an active metallic surface to obtain a reliable mutual contact relation.

In the embodiment shown in FIGS. 2 through 4, the contact 5 forms a spring mechanism for pushing up the contact shutter member 11 and the supporting portion 14 acting on the electric part 3. Alternatively, in another embodiment shown in FIG. 5, the socket body 1 can be provided with a coil spring 17 as a spring mechanism for pushing up the contact shutter member 11.

Figure 5A:
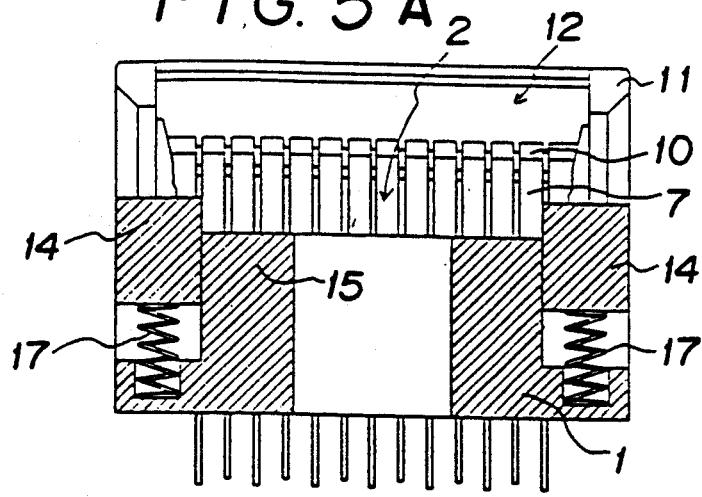
FIGS. 5(A), 5(B) and 5(C) are vertical sectional views in which embodiments using a coil spring as a spring means for pushing up the contact shutter member are shown in such a way as to correspond to the actions of FIGS. 4(A), 4(B) and 4(C), respectively.
Figure 5B:
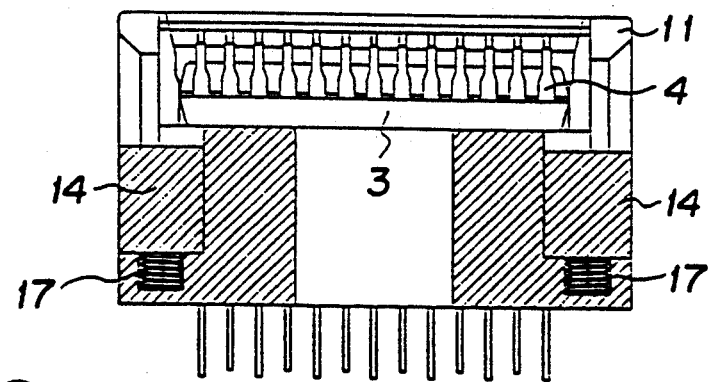
Figure 5C:
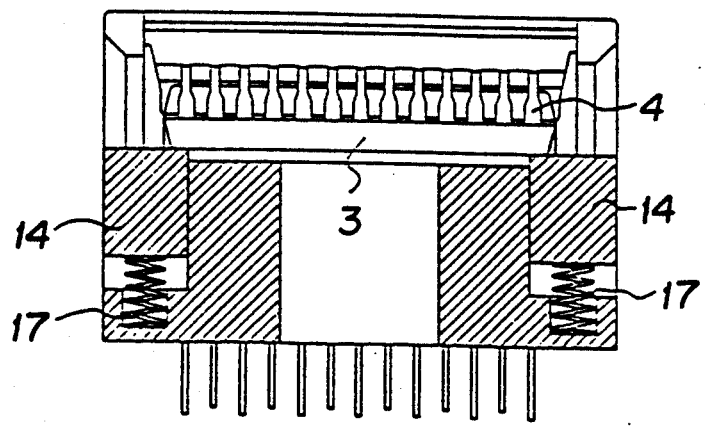

A coil spring 17 is disposed at a suitable place between the socket body 1 and the contact shutter member 11 to elastically support the contact shutter member 11. For example, the coil spring 17, as shown in FIG. 5, is disposed in such a manner as to push up the electric part supporting portion 14 integral with the contact shutter member 11. The coil spring 17 is compressed by a push-down operation of the contact shutter member 11, and pushes up the contact shutter member 11 by releasing the push-down operation as in the same manner described before. At a final stage of this operation, the supporting portion 14 is caused to act on the electric part 3 to pull it up to a position indicated by $c_1$ from a position indicated by $c_2$ in FIG. 2, thereby attaining a sliding movement of the contact nose portion after realization of the contacted relation between the contact 5 and the electric part terminal 4. Accordingly, the expansion stroke of the coil spring 17 is set as such that the coil spring 17 keeps pushing up the contact shutter member 11 and supporting portion 14 even after the realization of the contacted relation.

As described in the foregoing, according to the present invention, by virtue of such construction as that the contact shutter member is pushed up by the spring mechanism to realize a waiting state of the contact shutter member, a frictional contact between the terminal and the contact can be realized at the contacted portions when the electric part is pushed up by the electric part supporting portion. An active metallic surface can thus exposed on the contacted surfaces, thus enabling clean electric contact relation. Therefore, a highly reliable contact relation can be obtained even with a comparatively weak contacting pressure. As a result, since reliability of the contact relation can be maintained even if the contact is miniaturized, it can effectively cope with high density arrangements of electric part terminals.

Furthermore, by reducing the elastic force of the contact by miniaturizing the same, it also becomes possible to reduce the push-down force or be exerted to the contact shutter member.

Moreover, according to the present invention, since the upward and downward operations of the contact shutter member are utilized, the above-mentioned effect can automatically be obtained each time the electric part is inserted into the socket, and therefore, a highly reliable contact relation can surely be expected for each electric part which is to be inserted into and removed from the socket.

While specific embodiments of the present invention have been shown and described, it will be understood that many modifications and alternation may be made within the spirit of the present invention.

What is claimed is:

1. A socket for an electric component having a plurality of terminals, said socket comprising:
    a socket body having a plurality of elastic contacts adapted to contact the terminals of the electric component;
    a movable contact shutter member disposed on an upper part of said socket body for upward and downward movement relative to said socket body for backward displacement of said contacts against the elasticity thereof upon downward movement and forward displacement of said contacts due to the elasticity thereof upon upward movement of said movable contact shutter member;
    means for causing a sliding movement between said plurality of contacts and the terminals of the electric component when the electric component is mounted in said socket body, said means comprising said movable contact shutter member having an electric component supporting portion which is one piece therewith and movable upward and downward together with said movable contact shutter member for supporting the electric component and a spring means arranged on said socket body for upwardly biasing said movable contact shutter member, wherein when said movable contact shutter member is lowered and said contacts move backward for the mounting of the electric component, said spring means subsequently moves said movable contact shutter member upward, causing said electric component supporting portion to move the electric component upward, the terminals thereof sliding against said contacts.

2. The socket of claim 1, wherein:
    each said contact has a spring portion providing the elasticity thereof, and said spring means comprises said spring portions of said plurality of contacts.

3. The socket of claim 1, wherein:
    said spring means comprises a coil spring mounted between said socket body and said movable contact shutter member.

4. The socket of claim 1, wherein:
    said socket body has two opposing sides on which said plurality of contacts are arranged in parallel, an electric component accommodating section between said two opposing sides and another two opposing sides; and
    said electric component supporting portion of said movable contact shutter member is disposed between the first two opposing sides having plurality of contacts and at the second two opposing sides for supporting the lower surface of the electric component.

5. The socket of claim 1, wherein:

said socket body has an electric component accommodating portion having a bottom wall defining a mount table for supporting the lower surface of the electric component and a guide formed at an end portion of said mount table in said socket body guiding upward and downward movements of said electric component supporting portion and said movable contact shutter member, said electric component supporting portion being engaged with said guide.

6. A socket for an electric component having a plurality of terminals, said socket comprising:

a socket body having a plurality of elastic contacts adapted to contact the terminals of the electric component;

a movable contact shutter member disposed on an upper part of said socket body for upward and downward movement relative to said socket body for backward displacement of said contacts against the elasticity thereof upon downward movement and forward displacement of said contacts due to the elasticity thereof upon upward movement of said movable contact shutter member;

an electric component accommodating portion in said socket body, said electric component accommodating portion having a mount table for supporting the lower surface of the electric component;

an electric component supporting portion which is one piece with said movable contact shutter member for movably supporting the electric component, wherein said movable contact shutter member is movable on said socket body, together with said electric component supporting portion, between a first position whereat said electric component supporting portion is above said mount table and a second position whereat said electric component supporting portion is not above said mount table; and a spring means arranged on said socket body for biasing said movable contact shutter member toward said first position.

7. The socket of claim 6, wherein:

each said contact has a spring portion providing the elasticity thereof, and said spring means comprises said spring portions of said plurality of contacts.

8. The socket of claim 6, wherein:

said spring means comprises a coil spring mounted between said socket body and said movable contact shutter member.

9. The socket of claim 6, wherein a guide is formed at an end portion of said mount table in said socket body guiding upward and downward movements of said electric component supporting portion and said movable contact shutter member, said electric component supporting portion being engaged with said guide.

* * * * *